(12) United States Patent
Marten et al.

(10) Patent No.: US 8,995,123 B2
(45) Date of Patent: Mar. 31, 2015

(54) COOLING AND NOISE-REDUCTION APPARATUS

(71) Applicant: International Business Machines Corporation, Armonk, NY (US)

(72) Inventors: Andreas Marten, Fair Oak (GB); Martin R. Naish, Bershire (GB); Brian Stewart, Winchester (GB); Sam Rogers, Winchester (GB); Paul Thorpe, Winchester (GB)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/074,229

(22) Filed: Nov. 7, 2013

(65) Prior Publication Data

US 2014/0078666 A1 Mar. 20, 2014

Related U.S. Application Data

(63) Continuation of application No. 13/355,996, filed on Jan. 23, 2012, now abandoned.

(51) Int. Cl.
*G06F 1/20* (2006.01)
*H05K 7/20* (2006.01)

(52) U.S. Cl.
CPC .............. *H05K 7/20209* (2013.01); *G06F 1/20* (2013.01); *H05K 7/20745* (2013.01)
USPC .................... 361/679.5; 361/679.51; 361/691; 361/692; 361/695; 165/104.33; 165/122; 454/184; 700/276; 700/299

(58) Field of Classification Search
USPC ......................... 361/679.46–679.55, 688–696, 361/724–727; 165/80.2, 80.3, 104.19, 165/104.33, 121–126, 185; 454/184, 256, 454/258; 700/276, 299, 300; 312/223.2, 312/223.3, 236, 265.1; 236/49.3, 51
See application file for complete search history.

(56) References Cited

U.S. PATENT DOCUMENTS

| | | | |
|---|---|---|---|
| 4,446,774 A | 5/1984 | Meckler | |
| 4,625,633 A | 12/1986 | Martin | |
| 4,690,042 A | 9/1987 | Bertelsen et al. | |
| 4,784,445 A | 11/1988 | Ott | |
| 4,974,915 A | 12/1990 | Bussard | |
| 5,004,149 A * | 4/1991 | Narikiyo et al. | ............. 236/49.3 |
| 5,065,832 A | 11/1991 | Mark | |
| 5,403,232 A | 4/1995 | Helm et al. | |
| 5,467,919 A * | 11/1995 | Tamblyn | ...................... 236/49.3 |

(Continued)

FOREIGN PATENT DOCUMENTS

| | | | |
|---|---|---|---|
| GB | 2464839 A * | 5/2010 | ................ G06F 1/20 |
| WO | 2007048194 A1 | 5/2007 | |

*Primary Examiner* — Michail V Datskovskiy
(74) *Attorney, Agent, or Firm* — Cantor Colburn LLP; Jeanine Ray-Yartletts

(57) ABSTRACT

A cooling and noise-reduction apparatus for a computing device disposable within a structure having a central air conditioning system is provided. The computing device includes a heat generating component, an enclosure having first and second inlets, a fan configured to drive coolant from the first inlet to the heat generating component, a vent operably interposed between the second inlet and the heat generating component and a controller coupled to the fan and the vent to respectively control operations thereof. The cooling and noise-reduction apparatus includes a ducting element configured to flexibly and fluidly couple the second inlet with the central air conditioning system.

16 Claims, 4 Drawing Sheets

(56) References Cited

U.S. PATENT DOCUMENTS

| | | | | |
|---|---|---|---|---|
| 5,636,286 | A | 6/1997 | Makabe et al. | |
| 5,959,836 | A | 9/1999 | Bhatia | |
| 6,151,211 | A | 11/2000 | Dayan et al. | |
| 6,220,955 | B1 | 4/2001 | Posa | |
| 6,229,701 | B1 * | 5/2001 | Kung et al. | 361/688 |
| 6,366,832 | B2 * | 4/2002 | Lomonaco et al. | 700/276 |
| 6,374,627 | B1 | 4/2002 | Schumacher et al. | |
| 6,535,382 | B2 * | 3/2003 | Bishop et al. | 361/690 |
| 6,653,703 | B2 | 11/2003 | Hosotani et al. | |
| 6,702,661 | B1 | 3/2004 | Clifton et al. | |
| 6,963,488 | B1 | 11/2005 | Chen | |
| 7,031,154 | B2 * | 4/2006 | Bash et al. | 361/690 |
| 7,074,123 | B2 | 7/2006 | Bettridge et al. | |
| 7,121,214 | B1 | 10/2006 | Toltzman et al. | |
| 7,236,359 | B2 | 6/2007 | Strobel | |
| 7,285,147 | B2 * | 10/2007 | Kuo et al. | 55/385.2 |
| 7,330,350 | B2 | 2/2008 | Hellriegel et al. | |
| 7,379,299 | B2 | 5/2008 | Walsh et al. | |
| 7,869,607 | B2 | 1/2011 | Barath et al. | |
| 7,925,746 | B1 * | 4/2011 | Melton | 709/224 |
| 8,004,839 | B2 | 8/2011 | Sato et al. | |
| 8,051,671 | B2 | 11/2011 | Vinson et al. | |
| 8,154,870 | B1 * | 4/2012 | Czamara et al. | 361/694 |
| 8,208,250 | B2 | 6/2012 | Mongia | |
| 8,348,731 | B2 * | 1/2013 | Johnson et al. | 454/184 |
| 2005/0278069 | A1 | 12/2005 | Bash et al. | |
| 2006/0168975 | A1 | 8/2006 | Malone et al. | |
| 2008/0218969 | A1 * | 9/2008 | Muraki | 361/695 |
| 2010/0190430 | A1 | 7/2010 | Rodriguez et al. | |
| 2010/0317278 | A1 | 12/2010 | Novick | |

* cited by examiner

COOLING AND NOISE-REDUCTION APPARATUS

CROSS REFERENCE TO RELATED APPLICATION

This application is a Continuation Application of U.S. Non-Provisional application Ser. No. 13/355,996, which was filed on Jan. 23, 2012. The entire contents of U.S. Non-Provisional application Ser. No. 13/355,996 are incorporated herein by reference.

BACKGROUND

The present invention relates to a cooling and noise-reduction apparatus and, more particularly, to a cooling and noise-reduction apparatus for a computing device disposable within a structure having a central air conditioning system.

In office environments, for example, desktop and laptop personal computers (PCs) generally include heat generating components, such as central processing units (CPUs). These heat generating components generate heat as they operate and tend to operate less efficiently as they become hotter and hotter. Thus, they need to be cooled by one of more fans installed in the local device. A desktop PC typically has two fans: one for the power supply and one for the processor. Many moderns desktop PCs have a third fan on the graphics card. Laptop PCs can be configured similarly.

These numerous fans all require power and all generate noise and this noise tends to increase with time as dust and/or dirt builds up on the fans and the associated ductwork. In addition, since the fans are constantly blowing air over often-times sensitive components and this air often contains numerous particles that can stick to component surfaces, a buildup of material can occur on the component surfaces. Over time, this can lead to computational errors and failures.

One solution to the noise problem has been to install larger, quieter fans. These larger, quieter fans often suffer from increased power demands and dust buildup, however. A solution to the dust buildup problem is to install filters on the fan, but this generally causes the fans to have to speed up to compensate and the filters eventually clog anyway. To reduce the power needs without larger fan installation, variable speed fans can be used. These fans can reduce noise output but can unfortunately become disadvantageous when the associated computer is in a high power mode and the fans need to operate at full output.

SUMMARY

According to an aspect of the invention, a cooling and noise-reduction apparatus for a computing device disposable within a structure having a central air conditioning system is provided. The computing device includes a heat generating component, an enclosure having first and second inlets, a fan configured to drive coolant from the first inlet to the heat generating component, a vent operably interposed between the second inlet and the heat generating component and a controller coupled to the fan and the vent to respectively control operations thereof. The cooling and noise-reduction apparatus includes a ducting element configured to flexibly and fluidly couple the second inlet with the central air conditioning system.

According to another aspect of the invention, a cooling and noise-reduction apparatus is provided and includes a central air conditioning system, a plurality of computing devices each including a heat generating component, an enclosure having first and second inlets, a fan configured to drive coolant from the first inlet to the heat generating component, a vent operably interposed between the second inlet and the heat generating component and a controller coupled to the fan and the vent to respectively control operations thereof and a plurality of ducting elements each being configured to flexibly and fluidly couple the respective second inlets of each of the plurality of computing devices with the central air conditioning system.

According to yet another aspect of the invention, a cooling and noise-reduction method for use with a computing device disposable within a structure having a central air conditioning system is provided. The computing device includes a heat generating component, an enclosure having first and second inlets, a fan configured to drive coolant from the first inlet to the heat generating component, a vent operably interposed between the second inlet and the heat generating component and a controller coupled to the fan and the vent to respectively control operations thereof. The method includes maintaining the fan and the vent in on and open conditions, respectively, during a startup state, maintaining the fan and the vent in off and open conditions, respectively, during an active condition and maintaining the fan in the on condition during a vent fail condition.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

By ducting central air along with power and networking data to desktop and/or laptop personal computers (PCs), the air provided to the PCs may be filtered centrally so that dust buildup at the PCs can be substantially reduced. Meanwhile, with the central air being provided by way of central fans, power consumption can be reduced as central fans tend to operate more efficiently than the sum of the local PC fans. Also, since the central fans are geographically remote from users, noise may be substantially decreased.

The above-noted improvements can be achieved by ducting existing air-conditioning systems to desktop PCs and deactivating the local fans at certain predefined times. If a separate system is needed, existing ducts used for both power and networking, which are present in most cases, could be used. For applications to laptop computers, a docking station with an air-duct attachment may be provided to cool the laptop while docked and letting the laptop rely on the local fans when in transit. For applications in a server environment, ducting to individual servers may remove the need to condition an entire server room.

Figure 1:
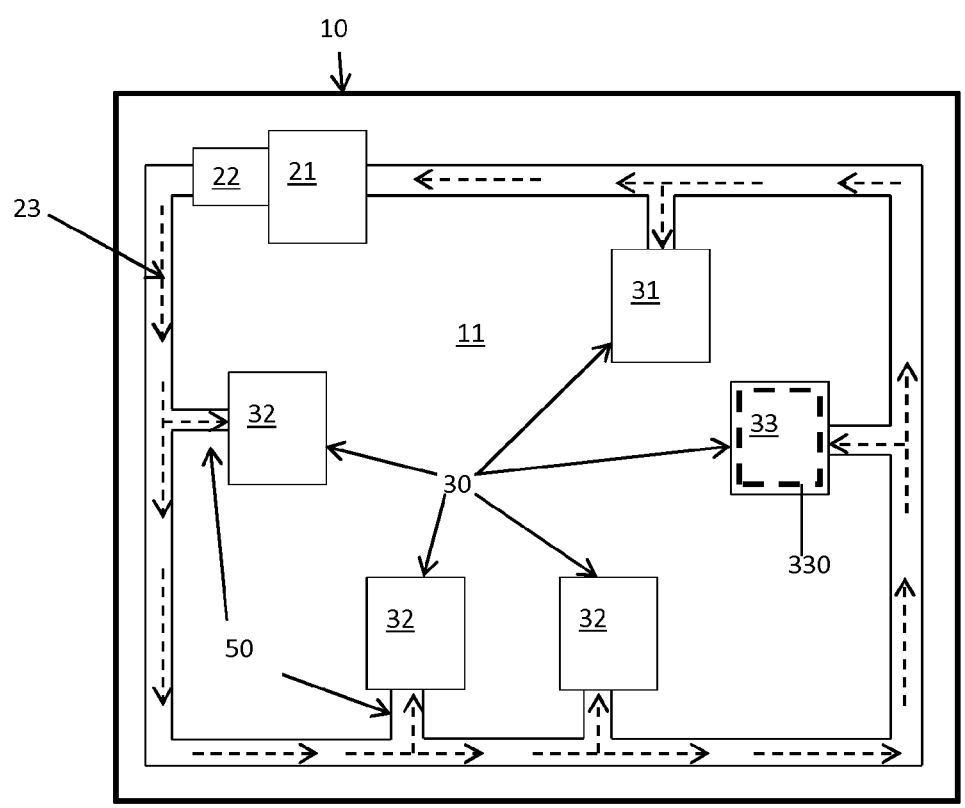
FIG. 1 is a schematic illustration of a structure having a central air conditioning system.

With reference now to FIG. 1, a structure 10 is provided. The structure 10 may be any structural element including, but not limited to, a building, an office building, a residence, etc. Among other features, the structure 10 includes one or more interior spaces 11 and a central air conditioning system 20. The central air conditioning system 20 includes an air conditioning unit 21, which may be disposed within or outside of the one or more interior spaces 11, a blower 22 and a main conduit 23. The air conditioning unit 21 is configured to generate cooling or heating air and the blower 22 is configured to drive this air as an air flow through the main conduit 23 toward the one or more interior spaces 11.

As shown in FIG. 1, a plurality of computing devices 30 may be disposed within the one or more interior spaces 11. The plurality of computing devices 30 may include various types of computing devices such as, but not limited to, one or more servers 31, one or more personal desktop computing devices 32 and one or more portable/laptop computing devices 33. The one or more portable/laptop computing devices 33 may be dockable in one or more corresponding docking stations 330.

While each of the plurality of computing devices 30 may have a different set of features and functionalities, each may have certain features in common. For example, with reference to FIG. 2, each of the plurality of computing devices 30 may include a heat generating component 40 that requires cooling during operations thereof, an enclosure 41 having a first inlet 410 and a second inlet 411, a fan 42, a vent 43 and a controller 44. The heat generating component 40 may include any type of operational electrical component such as, but not limited to, a mother board, a central processing unit (CPU), etc. The fan 42 may be configured to drive, for example, coolant from the first inlet 410 toward the heat generating component 40. The vent 43 may be operably interposed between the second inlet 411 and the heat generating component 40. With the central air conditioning system 20 operational, the vent 43 may be opened such that the coolant is permitted to flow from the central air conditioning system 20 toward the heat generating component 40. The controller 44 may be operably coupled to the fan 42 and the vent 43 to thereby respectively control operations of the fan 42 and the vent 43. The enclosure 41 houses each of the above-mentioned components in a manner that substantially reduces atmospheric communication between an exterior and an interior of the enclosure 41.

With reference to FIGS. 1-4, a plurality of ducting elements 50 are also provided. Each of the plurality of ducting elements 50 may include a flexible tubular element 51 having a first end 510 and a second end 511 opposite the first end 510. The flexible tubular element 51 may be coupled to the main conduit 23 at the first end 510 and may be coupled to a corresponding one of the plurality of computing devices 30 at the second end 511. In particular, the flexible tubular element 51 may be coupled to the second inlet 411 of the corresponding one of the plurality of computing devices 30 at the second end 511. In this way, each of the plurality of ducting elements 50 fluidly couples the corresponding second inlets 411 with the central air conditioning system 20. As such, air flow driven through the main conduit 23, such as cooling air flow, can be delivered to the corresponding second inlets 411 for cooling of the corresponding heat generating component 40.

Figure 2:
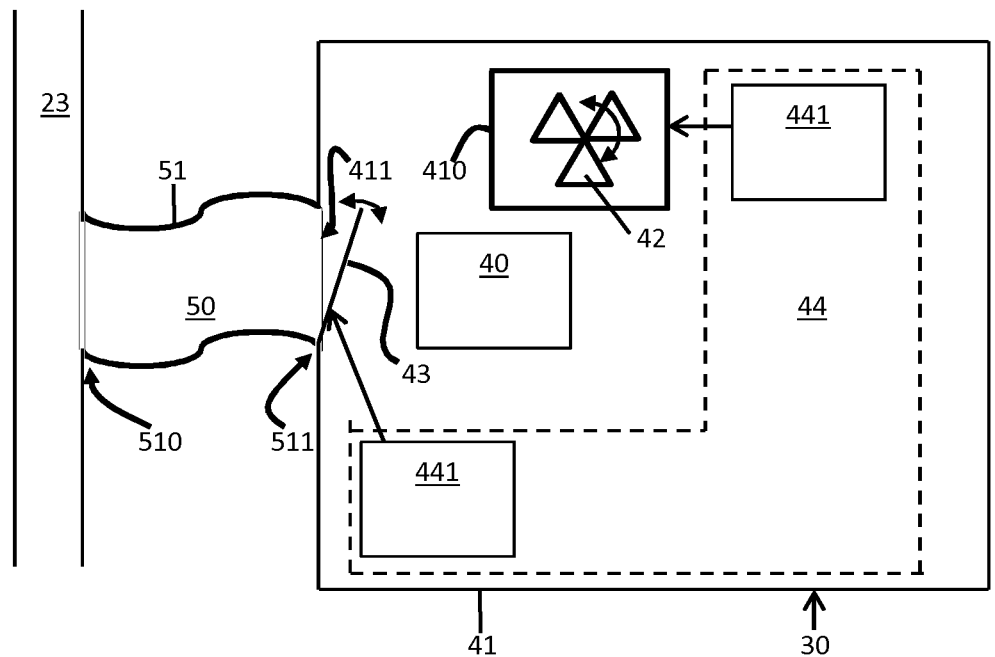
FIG. 2 is a schematic illustration of a computing device disposable within the structure of FIG. 1.
Figure 3:
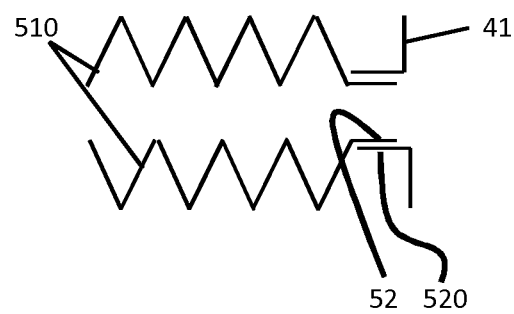
FIG. 3 is a side view of a corrugated duct in accordance with embodiments.
Figure 4:
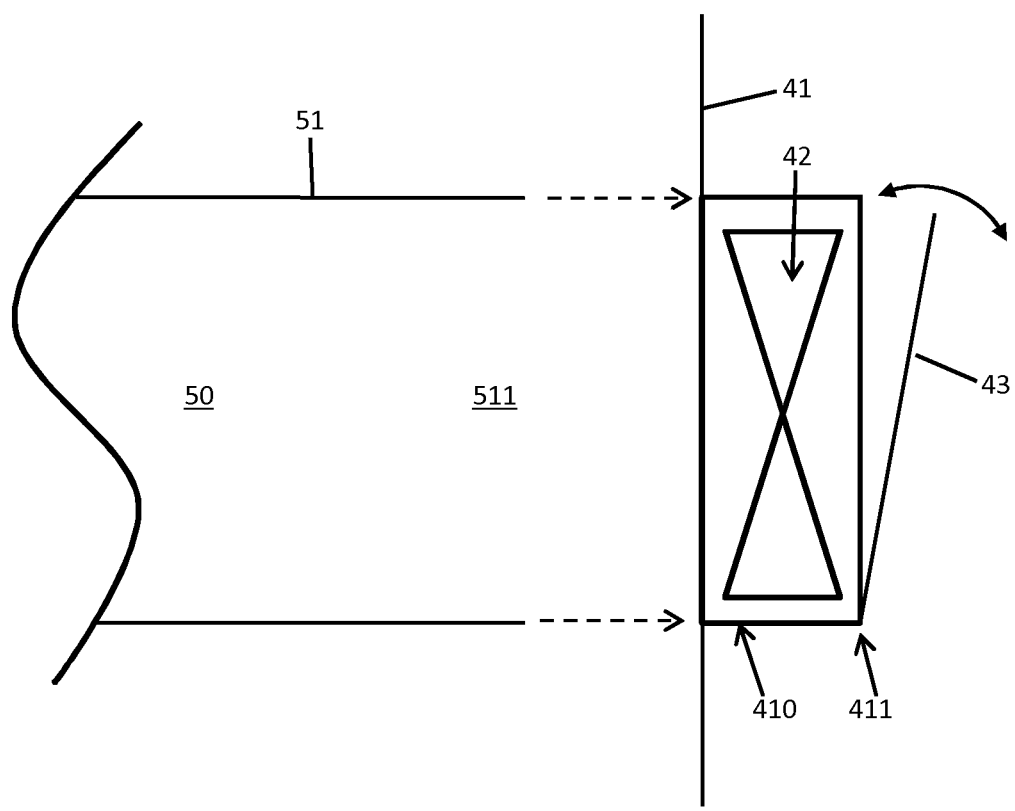
FIG. 4 is a schematic side view of an enlarged portion of the computing device of FIG. 2 in accordance with alternative embodiments.

As shown in FIGS. 2 and 3 and, in accordance with embodiments, the flexible tubular element 51 may include a corrugated duct 510 that permits the flexible tubular element 51 to bend in one or more places and to stretch over extended distances, if necessary. In this way, the corresponding one of the computing devices 30 may be positioned and repositioned to suit a user. Also, the flexible tubular element 51 may include a neck portion 52 at the second end 511. The neck portion 52 can be configured to tightly fit with a complementary connector 520 of the enclosure 41. Of course, it is to be understood that this is merely exemplary and that the flexible tubular element 51 can be connected to the enclosure 41 is various manners.

In accordance with further embodiments, it is to be understood that the first inlet 410 and the second inlet 411 may be provided as a single inlet or as multiple co-axial inlets. In either case, the flexible tubular element 51 and the fan 42 may be provided along a common center-line such that air flow provided through the ducting element 50 passes through the fan 42 and/or the fan housing. In this case, the flexible tubular element 51 may be configured to be connectable with the fan and/or the fan housing.

Each controller 44 of each of the plurality of computing devices 30 may include a fan control unit 440 and a vent control logic unit 441. The fan control unit 440 is operably coupled to the corresponding fan 42 and is configured to control at least one or both of an on/off state of the corresponding fan 42 and a rotational speed of the corresponding fan 42. The vent control logic unit 441 is operably coupled to the corresponding vent 43 and is configured to control an opening, a closing and/or a vent angle of the corresponding vent 43.

Although illustrated in FIG. 2 as being two separate units, it is to be understood that in some embodiments the fan control unit 440 and the vent control logic unit 441 reside as a single controller 44 that is operated and/or controlled by the heat generating component 40. In these cases, one or both of the fan control unit 440 and the vent control logic unit 441 may be embodied as a computer readable medium having executable instructions stored thereon for executing at least the control methods described herein.

Figure 5:
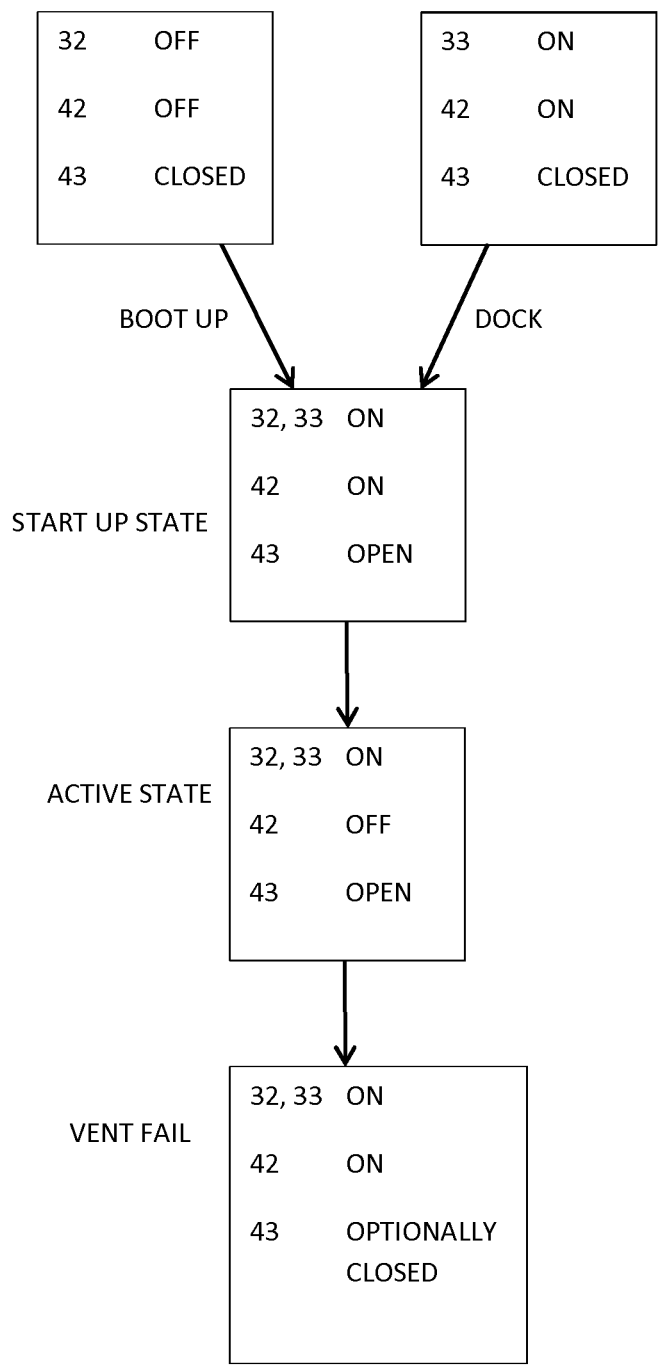
FIG. 5 is a flow diagram illustrating an operation of a cooling and noise-reduction system for use with the computing device of FIG. 1.

With reference to FIG. 5 and, in accordance with embodiments, each controller 44 of the plurality of computing devices 30 is configured to operate in at least three distinct modes. In a first mode, which may be associated with a startup state of the corresponding computing device 30, the controller 44 may be configured to maintain the corresponding fan 42 in an on condition and to maintain the corresponding vent 43 in an open condition. For the personal desktop computing devices 32, the startup state may be preceded by a standard boot up procedure during which the personal desktop computing devices 32 are disposed at least initially in an off condition, the corresponding fans 42 are disposed in an off condition and the corresponding vents 43 are closed. For the laptop computing devices 33, the startup state may be preceded by a docking procedure during which the laptop computing devices 33 are disposed at least initially in an on condition, the corresponding fans 42 are disposed in an on condition and the corresponding vents 43 are closed.

In a second mode, which may be associated with an active state of the corresponding computing device 30 whereby the boot up procedures are completed and computational operations can be fully executed, the controller 44 may be configured to maintain the corresponding fan 42 in an off condition and to maintain the corresponding vent 43 in an open condition. In this way, the heat generating component 40 may be cooled, for example, by the central air conditioning system 20 as necessary with the fan 42 turned off. This should allow for less noise generation and lowered power requirements as the central air conditioning system 20 is remote and may operate more efficiently than the fan 42.

In a third mode, which may be associated with a vent failure whereby cooling air fails to flow through the vent 43, the controller 44 may be configured to maintain the corresponding fan 42 in the on condition such that the heat generating component 40 can be continually operated and cooled. A vent failure condition can be characterized as any condition in which air flow does not or cannot flow through the vent 43. Thus, exemplary vent failures may be due to the vent 43 being broken or otherwise non-operative or due to the central air conditioning system 20 being non-operative. In the latter case, this can occur if the structure 10 is an office building and the user attempts to during a holiday during which the central air conditioning system 20 is turned off. In this case, the controller 44 can close the vent 43 to prevent outflow of coolant from an interior of the enclosure 41 and operate the fan 42 normally to cool the heat generating component 40.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A cooling and noise-reduction apparatus, comprising:
   a central air conditioning system;
   a plurality of computing devices each including a heat generating component, an enclosure having first and second inlets, a fan configured to drive coolant from the first inlet to the heat generating component, a vent operably interposed between the second inlet and the heat generating component and a controller coupled to the fan and the vent to respectively control operations thereof; and
   a plurality of ducting elements each being configured to flexibly and fluidly couple the respective second inlets of each of the plurality of computing devices with the central air conditioning system.

2. The cooling and noise-reduction apparatus according to claim 1, wherein the plurality of computing devices comprises:
   one or more servers;
   one or more desktop computing devices; and
   one or more portable computing devices.

3. The cooling and noise-reduction apparatus according to claim 2, further comprising one or more docking stations for the one or more portable computing devices.

4. The cooling and noise-reduction apparatus according to claim 1, wherein the heat generating component comprises at least one of a mother board and a central processing unit.

5. The cooling and noise-reduction apparatus according to claim 1, wherein each controller of the plurality of computing devices comprises:
   a fan control unit operably coupled to the corresponding fan to control an on/off state and a rotational speed of the corresponding fan; and
   a vent control logic unit operably coupled to the corresponding vent to control an opening, a closing and a vent angle of the corresponding vent.

6. The cooling and noise-reduction apparatus according to claim 1, wherein each controller of the plurality of computing devices is configured to:
   maintain the corresponding fan and the corresponding vent in on and open conditions, respectively, during a startup state,
   maintain the corresponding fan and the corresponding vent in off and open conditions, respectively, during an active condition, and
   maintain the corresponding fan in the on condition during a vent fail condition.

7. The cooling and noise-reduction apparatus according to claim 6, wherein each controller of the plurality of computing devices is further configured to close the vent during the vent fail condition.

8. The cooling and noise-reduction apparatus according to claim 1, wherein each of the plurality of ducting elements comprises a corrugated duct.

9. A cooling and noise-reduction apparatus, comprising:
   a plurality of computing devices;
   each computing device comprising:
   a heat generating component;
   an enclosure having first and second inlets;
   a fan configured to drive coolant from the first inlet to the heat generating component;
   a vent operably interposed between the second inlet and the heat generating component; and
   a controller coupled to the fan and the vent to respectively control operations thereof, the cooling and noise-reduction apparatus further comprising:
   a plurality of ducting elements;
   each ducting element being configured to flexibly and fluidly couple the respective second inlets of each of the plurality of computing devices with an air conditioning system.

10. The cooling and noise-reduction apparatus according to claim 9, wherein the plurality of computing devices comprises:
- one or more servers;
- one or more desktop computing devices; and
- one or more portable computing devices.

11. The cooling and noise-reduction apparatus according to claim 10, further comprising one or more docking stations for the one or more portable computing devices.

12. The cooling and noise-reduction apparatus according to claim 9, wherein the heat generating component comprises at least one of a mother board and a central processing unit.

13. The cooling and noise-reduction apparatus according to claim 9, wherein each controller of the plurality of computing devices comprises:
- a fan control unit operably coupled to the corresponding fan to control an on/off state and a rotational speed of the corresponding fan; and
- a vent control logic unit operably coupled to the corresponding vent to control an opening, a closing and a vent angle of the corresponding vent.

14. The cooling and noise-reduction apparatus according to claim 9, wherein each controller of the plurality of computing devices is configured to:
- maintain the corresponding fan and the corresponding vent in on and open conditions, respectively, during a startup state,
- maintain the corresponding fan and the corresponding vent in off and open conditions, respectively, during an active condition, and
- maintain the corresponding fan in the on condition during a vent fail condition.

15. The cooling and noise-reduction apparatus according to claim 14, wherein each controller of the plurality of computing devices is further configured to close the vent during the vent fail condition.

16. The cooling and noise-reduction apparatus according to claim 9, wherein each of the plurality of ducting elements comprises a corrugated duct.

\* \* \* \* \*